United States Patent
Cheng et al.

(10) Patent No.: US 10,685,872 B2
(45) Date of Patent: Jun. 16, 2020

(54) ELECTRICALLY ISOLATED CONTACTS IN AN ACTIVE REGION OF A SEMICONDUCTOR DEVICE

(71) Applicant: International Business Machines Corporation, Armonk, NY (US)

(72) Inventors: Kangguo Cheng, Schenectady, NY (US); Peng Xu, Santa Clara, CA (US); Ekmini A. De Silva, Slingerlands, NY (US); Ruilong Xie, Schenectady, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/992,339

(22) Filed: May 30, 2018

(65) Prior Publication Data

US 2019/0371654 A1 Dec. 5, 2019

(51) Int. Cl.
| | | |
|---|---|---|
| *H01L 23/52* | (2006.01) |
| *H01L 29/41* | (2006.01) |
| *H01L 21/28* | (2006.01) |
| *H01L 21/76* | (2006.01) |
| *H01L 21/768* | (2006.01) |
| *H01L 23/522* | (2006.01) |
| *H01L 29/417* | (2006.01) |
| *H01L 21/285* | (2006.01) |
| *H01L 21/311* | (2006.01) |

(52) U.S. Cl.
CPC .... *H01L 21/76816* (2013.01); *H01L 23/5226* (2013.01); *H01L 29/41775* (2013.01); *H01L 29/41791* (2013.01); *H01L 21/28247* (2013.01); *H01L 21/28518* (2013.01); *H01L 21/31116* (2013.01); *H01L 21/31144* (2013.01); *H01L 21/76834* (2013.01); *H01L 21/76877* (2013.01)

(58) Field of Classification Search
CPC ........... H01L 23/5226; H01L 29/41775; H01L 29/41791; H01L 21/28247; H01L 21/76834
See application file for complete search history.

(56) References Cited

U.S. PATENT DOCUMENTS 8,232,607 B2 7/2012 Edge et al.
9,070,711 B2 * 6/2015 Xie .................. H01L 29/66545
9,461,143 B2 * 10/2016 Pethe ................ H01L 21/76895
(Continued)

*Primary Examiner* — Ida M Soward
(74) *Attorney, Agent, or Firm* — Garg Law Firm, PLLC; Rakesh Garg; Joseph Petrokaitis

(57) ABSTRACT

A semiconductor device is formed where a conductive extension (e.g., a TS) electrically couples with a first structure (e.g., an S/D) of the semiconductor device, a dielectric is deposited at least on a surface of a second structure (e.g., a gate), where the surface is substantially parallel to a plane of fabrication of the semiconductor device. An insulator cap surrounds an exposed portion of the extension. An opening is formed in the insulator cap, and a first contact (e.g., a CA) is formed through the opening to electrically couple with the first structure. A second contact (e.g., a CB) is formed through an opening in the dielectric at a first portion of the surface and electrically couples with the second structure. The dielectric continues to cover a second portion of the surface, and a portion of the insulator cap is interposed between the first contact and the second contact.

8 Claims, 10 Drawing Sheets

(56) References Cited

U.S. PATENT DOCUMENTS

| | | | |
|---|---|---|---|
| 9,620,622 B2 | 4/2017 | Farmer et al. | |
| 9,824,921 B1 | 11/2017 | Labonte et al. | |
| 10,032,887 B2 * | 7/2018 | Huang | H01L 21/76897 |
| 10,037,944 B2 * | 7/2018 | He | H01L 29/7851 |
| 10,153,351 B2 * | 12/2018 | Hsu | H01L 21/76867 |
| 10,249,726 B2 * | 4/2019 | Xie | H01L 29/665 |
| 10,361,199 B2 * | 7/2019 | Balakrishnan | H01L 21/76224 |
| 10,388,648 B2 * | 8/2019 | Balakrishnan | H01L 27/0617 |
| 2009/0321795 A1 * | 12/2009 | King | H01L 21/28052 |
| | | | 257/288 |
| 2011/0068395 A1 * | 3/2011 | Hebert | H01L 29/0865 |
| | | | 257/332 |
| 2015/0118836 A1 * | 4/2015 | Lin | H01L 29/66545 |
| | | | 438/586 |
| 2015/0132898 A1 * | 5/2015 | Cheng | H01L 29/66772 |
| | | | 438/151 |
| 2015/0137273 A1 | 5/2015 | Zhang et al. | |
| 2015/0179457 A1 * | 6/2015 | Hung | H01L 21/28008 |
| | | | 438/586 |
| 2015/0333136 A1 * | 11/2015 | Xie | H01L 29/66545 |
| | | | 257/384 |
| 2016/0133623 A1 * | 5/2016 | Xie | H01L 27/088 |
| | | | 257/384 |
| 2016/0204026 A1 * | 7/2016 | Liu | H01L 21/76834 |
| | | | 438/666 |
| 2016/0260812 A1 * | 9/2016 | Horak | H01L 21/28008 |
| 2016/0276462 A1 * | 9/2016 | Chiang | H01L 29/41775 |
| 2016/0284641 A1 * | 9/2016 | Liou | H01L 23/5226 |
| 2016/0307758 A1 * | 10/2016 | Li | H01L 21/02167 |
| 2017/0040218 A1 | 2/2017 | Bohr et al. | |
| 2017/0103896 A1 * | 4/2017 | Hung | H01L 29/66545 |
| 2017/0278747 A1 * | 9/2017 | Adusumilli | H01L 21/76897 |
| 2017/0288031 A1 * | 10/2017 | Ho | H01L 29/6656 |
| 2017/0373087 A1 * | 12/2017 | Ito | H01L 27/11582 |
| 2018/0182668 A1 * | 6/2018 | Xie | H01L 21/76897 |
| 2018/0350662 A1 * | 12/2018 | You | H01L 21/76802 |
| 2018/0358466 A1 * | 12/2018 | Chang | H01L 29/4232 |
| 2018/0374708 A1 * | 12/2018 | Lu | H01L 21/28132 |
| 2019/0252465 A1 * | 8/2019 | Frougier | H01L 27/2436 |
| 2019/0259667 A1 * | 8/2019 | Zang | H01L 29/785 |

* cited by examiner

ELECTRICALLY ISOLATED CONTACTS IN AN ACTIVE REGION OF A SEMICONDUCTOR DEVICE

TECHNICAL FIELD

The present invention relates generally to a method, system, and computer program product for fabricating semiconductor devices in which contacts are formed for coupling the device with an external circuit. More particularly, the present invention relates to a method, system, and computer program product for electrically isolated contacts in an active region of a semiconductor device.

BACKGROUND

A semiconductor device generally uses several layers of different materials to implement the device properties and function. A layer of material can be conductive, semiconductive, insulating, resistive, capacitive, or have any number of other properties. Different layers of materials have to be formed using different methods, given the nature of the material, the shape, size or placement of the material, other materials adjacent to the material, and many other considerations.

A Field Effect Transistor (FET) is a semiconductor device that controls the electrical conductivity between a source of electric current (source) and a destination of the electrical current (drain). The FET uses a semiconductor structure called a "gate" to create an electric field, which controls the shape and consequently the electrical conductivity of a channel between the source and the drain. The channel is a charge carrier pathway constructed using a semiconductor material.

Many semiconductor devices are planar, i.e., where the semiconductor structures are fabricated on one plane. A non-planar device is a three-dimensional (3D) device where some of the structures are formed above or below a given plane of fabrication.

A fin-Field Effect Transistor (finFET) is a non-planar device in which a source and a drain are connected using a fin-shaped conducting channel (fin) above the insulator layer. In an FET, a gate has a source-side and a drain-side. Generally, a finFET is fabricated as a multi-gate device in which two or more gates are coupled using one or more fin structures by connecting a drain of one gate to the source of another gate using a fin. For example, a fin of a finFET is usually fabricated between two gates such that the source of one gate is on one side of the fin and the drain of the other gate is on an opposite side of the fin. The direction along the lateral length of the fin running from one gate to the other gate is referred to herein as a lateral running direction of the fin.

A "contact" is an electrically conductive structure formed on an externally accessible surface of a semiconductor device. The semiconductor device, such as an FET, can be electrically connected into a circuit via the contacts. A contact of a semiconductor device electrically couples to one or more structures, generally a single structure, within the semiconductor device. Regardless of the planar or non-planar nature of a semiconductor device, such as the FET, various electrical contacts are generally formed or positioned on a single externally accessible surface of the device for the ease of connecting the device in a circuit.

For example, in a transistor device, one contact connects to the gate structure in the device, one contact connects to the source structure in the device, and one contact connects to the drain structure in the device. Depending on the type of the transistor, additional contacts may be available, e.g., a contact connecting to the fin in a finFET.

A CA contact is an electrical connection that connects to a source/drain (S/D) structure. A CB contact is an electrical connection that connects to a gate structure. A CB contact is fabricated on one surface—usually the top surface (also referred to herein as the frontside) of the device. A circuit external to the finFET uses the CB contact to electrically connect a part of the circuit to a gate in the finFET. The frontside of the finFET is the side opposite to the side of the gate facing the substrate of the device. The side of the gate facing the substrate is referred to herein as the backside of the device.

A TS contact is an electrical contact that provides electrical connectivity to the one or more fins that connect two or more gates to one another. A circuit external to the finFET uses the TS contact to electrically connect a part of the circuit to a fin in the finFET.

A CA contact can be fabricated to electrically couple to the TS contact. However fabricated, the CA contact(s) should be electrically insulated from the CB contact.

For the purposes of the illustrative embodiments, the orientation of the device is described in a three-dimensional space using X, Y, and Z coordinate system. The plane of fabrication is assumed to be the X-Z plane, with vertical structures above the fabrication plane extending in +Y direction and the vertical structures below the fabrication plane extending in −Y direction. This example orientation is not intended to be limiting. From this disclosure, those of ordinary skill in the art will be able to conceive other orientations of semiconductor devices in which an embodiment described herein can be adapted, and such alternate orientations and adaptations are contemplated within the scope of the illustrative embodiments.

SUMMARY

The illustrative embodiments provide a method, system, and computer program product. An embodiment includes a fabrication method that forms a conductive extension, the extension electrically coupling with a first structure of the semiconductor device. The embodiment deposits a dielectric at least on a surface of a second structure (gate), wherein the surface is substantially parallel to a plane of fabrication of the semiconductor device. The embodiment forms an insulator cap surrounding an exposed portion of the extension. The embodiment forms an opening in the insulator cap, wherein a first contact is formed through the opening to electrically couple with the first structure of the semiconductor device. The embodiment forms a second contact in electrically coupling with a second structure of the semiconductor device, wherein the second contact is formed through an opening in the dielectric at a first portion of the surface, the dielectric continuing to cover a second portion of the surface, and wherein a portion of the insulator cap is interposed between the first contact and the second contact.

An embodiment includes a semiconductor fabrication system. The embodiment includes a processor, a computer-readable memory, and a computer-readable storage device, and program instructions stored on the storage device for execution by the processors via the memories, the stored program instructions causing the fabrication system to perform operations of the fabrication method.

An embodiment includes a semiconductor device. The semiconductor device includes structures formed according to the fabrication method.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of the illustrative embodiments when read in conjunction with the accompanying drawings, wherein:

DETAILED DESCRIPTION

Figure 1:
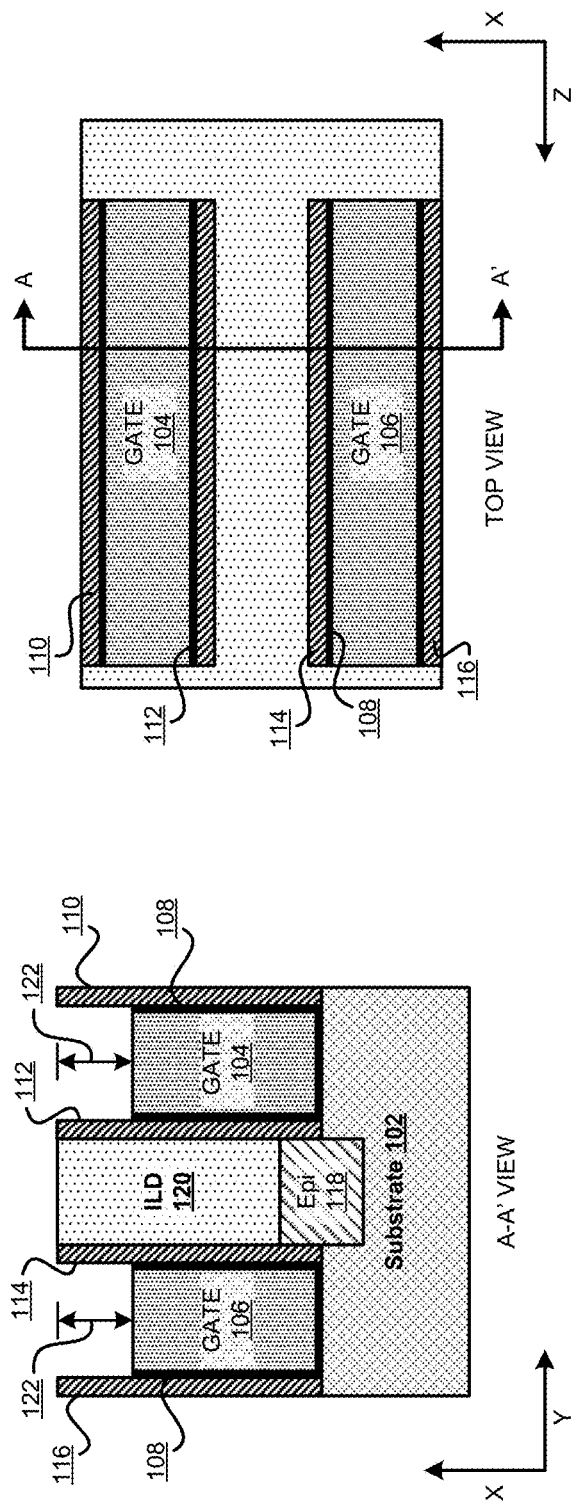
FIG. 1 depicts an example fabrication operation for fabricating an example semiconductor device with an isolation structure for electrically isolating one contact from another contact in accordance with an illustrative embodiment.

The illustrative embodiments recognize that even though the underlying structures to which a contact connects is extremely small—of the order of a few nanometers—the contacts themselves are significantly larger than those structures—of the order of micrometers or more. Thus, a contact can overlie several structures including the structure to which the contact provides electrical connectivity but also those structures with which the contact should remain electrically isolated.

The region where the structures of the device are fabricated is called an active region. The illustrative embodiments recognize that the entire semiconductor device may be fabricated in a region covered under an area of only few square-nanometers. Such an area presents a very limited space in which to fabricate relatively large contacts. The contacts, such as the CA and CB contacts, are often fabricated on the same plane or surface that overlies an active region. The lack of surface area on which such relatively large contacts are placed in close proximity to one another presents a great risk of electrical short-circuits between the contacts.

Thus, the illustrative embodiments recognize that a need exists for a method of fabricating contacts such that the contacts are electrically isolated from one another not just by spacing between them but by isolation providing structures interposed between the contacts during fabrication. Such isolation of contacts by specially fabricated isolation structures is especially important to ensure reliable operation of the devices as the device dimensions continue to shrink but the external circuits continue to use substantially larger contacts for connectivity to the device structures.

The illustrative embodiments used to describe the invention generally address and solve the above-described needs and other problems related to fabricating electrically isolated contacts in an active region of a semiconductor device. The illustrative embodiments provide a fabrication method for electrically isolated contacts in an active region of a semiconductor device.

An embodiment comprises a semiconductor device described herein. Another embodiment comprises a fabrication process for the contemplated semiconductor device and can be implemented as a software application. The software application implementing an embodiment can be configured as a modification of an existing semiconductor fabrication system—such as a photolithography system, as a separate application that operates in conjunction with an existing semiconductor fabrication system, a standalone application, or some combination thereof. For example, the application causes the semiconductor fabrication system to perform the steps described herein, to fabricate electrically isolated contacts in an active region of a semiconductor device, as described herein.

For the clarity of the description, and without implying any limitation thereto, the illustrative embodiments are described using a specific device, namely a finFET. Within the scope of the illustrative embodiments, an embodiment can be implemented with a variety of other devices, where contacts are fabricated in or over an active region of the device, presenting electrical short-circuit issues, as recognized and remedied using the example finFET.

Furthermore, simplified diagrams of the example structures, elements, and device(s) are used in the figures and the illustrative embodiments. In an actual fabrication of a proposed device, additional structures that are not shown or described herein, or structures different from those shown and described herein, may be present without departing the scope of the illustrative embodiments. Similarly, within the scope of the illustrative embodiments, a shown or described structure in the example device may be fabricated differently to yield a similar operation or result as described herein.

Differently shaded portions in the two-dimensional drawing of the example structures, layers, and formations are intended to represent different structures, layers, and formations in the example fabrication, as described herein. Similar materials may be shaded differently, and different materials may be shaded similarly for clarity of the depiction, and may be used as described in their corresponding descriptions. The different structures, layers, and formations may be fabricated using suitable materials that are known to those of ordinary skill in the art as belonging to the same class of materials described herein.

A specific shape, location, position, or dimension of a shape depicted herein is not intended to be limiting on the illustrative embodiments unless such a characteristic is expressly described as a feature of an embodiment. The shape, location, position, dimension, or some combination thereof, are chosen only for the clarity of the drawings and the description and may have been exaggerated, minimized, or otherwise changed from actual shape, location, position, or dimension that might be used in actual photolithography to achieve an objective according to the illustrative embodiments.

Furthermore, the illustrative embodiments are described with respect to a specific actual or hypothetical semiconductor device only as an example. The steps described by the various illustrative embodiments can be adapted for fabricating a variety of planar and non-planar devices in a similar manner, and such adaptations are contemplated within the scope of the illustrative embodiments. The specific placements of contacts are also used only as non-limiting examples to describe certain options possible with the illustrative embodiments. Those of ordinary skill in the art will be able to use an embodiment to similarly provide electrical isolation to other placements of the contacts in a similar manner, and such usage is also contemplated within the scope of the illustrative embodiments.

An embodiment when implemented in an application causes a fabrication process to perform certain steps as described herein. The steps of the fabrication process are depicted in the several figures. Not all steps may be necessary in a particular fabrication process. Some fabrication processes may implement the steps in different order, combine certain steps, remove or replace certain steps, or perform some combination of these and other manipulations of steps, without departing the scope of the illustrative embodiments.

A device of an embodiment described herein, comprises substantial advancement of the semiconductor device fabrication technology. A manner of electrical isolation of contacts by fabricating specific isolation structures as described herein is unavailable in the presently available methods. Thus, a substantial advancement of such devices or data processing systems by executing a method of an embodiment is in an improved fabrication process for electrically isolating conductive contacts that couple to different device structures and mitigates the possibility of electrical short-circuit between distinct contacts.

The illustrative embodiments are described with respect to certain types of devices, electrical properties, structures, formations, layers, orientations, directions, steps, operations, planes, materials, dimensions, numerosity, data processing systems, environments, components, and applications only as examples. Any specific manifestations of these and other similar artifacts are not intended to be limiting to the invention. Any suitable manifestation of these and other similar artifacts can be selected within the scope of the illustrative embodiments.

The illustrative embodiments are described using specific code, designs, architectures, protocols, layouts, schematics, and tools only as examples and are not limiting to the illustrative embodiments. Furthermore, the illustrative embodiments are described in some instances using particular software, tools, and data processing environments only as an example for the clarity of the description. The illustrative embodiments may be used in conjunction with other comparable or similarly purposed structures, systems, applications, or architectures.

The examples in this disclosure are used only for the clarity of the description and are not limiting to the illustrative embodiments. Additional structures, operations, actions, tasks, activities, and manipulations will be conceivable from this disclosure and the same are contemplated within the scope of the illustrative embodiments.

Any advantages listed herein are only examples and are not intended to be limiting to the illustrative embodiments. Additional or different advantages may be realized by specific illustrative embodiments. Furthermore, a particular illustrative embodiment may have some, all, or none of the advantages listed above.

A substrate contemplated within the scope of the illustrative embodiments can be formed using any suitable substrate material, such as, for example, monocrystalline Silicon (Si), Silicon-Germanium (SiGe), Silicon-Carbon(SiC), compound semiconductors obtained by combining group III elements from the periodic table (e.g., Al, Ga, In) with group V elements from the periodic table (e.g., N, P, As, Sb) (III-V compound semiconductor), compounds obtained by combining a metal from either group 2 or 12 of the periodic table and a nonmetal from group 16 (the chalcogens, formerly called group VI) (II-VI compound semiconductor), or semiconductor-on-insulator (SOI). In some embodiments of the invention, the substrate includes a buried oxide layer (not depicted). Fins (not shown) are semiconductor structures that are formed using the same material or different materials from the substrate.

Fins can be formed by any suitable patterning techniques, including but not limited to, lithography followed by etching. Other suitable techniques, such as sidewall image transfer (SIT), self-aligned double patterning (SADP), self-aligned multiple patterning (SAMP), self-aligned quadruple patterning (SAQP) can be used.

Source and drain structures are formed on the opposite sides of a gate. An S/D structure is offset or separated from the gate by one or more gate spacers. In one example embodiment, source and drain structures are formed from an in-situ doped (i.e., during growth) epitaxial material such as in-situ doped epitaxial Si, carbon doped silicon (Si:C) and/or SiGe. Suitable n-type dopants include but are not limited to phosphorous (P), and suitable p-type dopants include but are not limited to Boron (B). The use of an in-situ doping process is merely an example. For instance, an ex-situ process can be used instead of the in-situ process to introduce dopants into the source and drain structures. Other doping techniques include but are not limited to, ion implantation after the bottom source/drain are formed. Dopant techniques include but are not limited to, ion implantation, gas phase doping, plasma doping, plasma immersion ion implantation, cluster doping, infusion doping, liquid phase doping, solid phase doping, in-situ epitaxy growth, or any suitable combination of those techniques.

Gate spacers are formed using a suitable spacer material. Some examples of the spacer material include, but are not limited to, Silicon nitride (SiN), Silicon carbide (SiC), Carbon-doped Silicon oxide (SiOC), Silicon-carbon-nitride (SiCN), Boron nitride (BN), Silicon Boron nitride (SiBN), Silicoboron carbonitride (SiBCN), Silicon oxycabonitride (SiOCN), Silicon oxynitride (SiON), and combinations thereof. The spacer material also acts as a dielectric material. The dielectric material used as spacer material can be a suitable low-k (low dielectric constant) material, such as a material having a dielectric constant less than approximately 7, or preferably less than approximately 5.

A gate can comprise a gate dielectric and a gate conductor. Gate dielectric can comprise any suitable dielectric material, including but not limited to silicon oxide, silicon nitride, silicon oxynitride, other high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k gate dielectric material may further include dopants such as lanthanum, aluminum, magnesium. A gate structure of the gate dielectric material can be formed by any suitable process or any suitable combination of multiple processes, including but not limited to, furnace oxidation, rapid thermal oxidation, dry oxidation, wet oxidation, thermal oxidation, chemical oxidation, thermal nitridation, plasma oxidation, plasma nitridation, atomic layer deposition (ALD), chemical vapor deposition (CVD), etc. In some embodiments, the gate dielectric has a thickness ranging from 1 nm to 5 nm, although less thickness and greater thickness are also contemplated.

The gate conductor can comprise any suitable conducting material, including but not limited to, doped polycrystalline or amorphous silicon, germanium, silicon germanium, a metal (e.g., tungsten (W), titanium (Ti), tantalum (Ta), ruthenium (Ru), hafnium (Hf), zirconium (Zr), cobalt (Co), nickel (Ni), copper (Cu), aluminum (Al), platinum (Pt), tin (Sn), silver (Ag), gold (Au), a conducting metallic compound material (e.g., tantalum nitride (TaN), titanium nitride (TiN), tantalum carbide (TaC), titanium carbide (TiC), titanium aluminum carbide (TiAlC), tungsten silicide (WSi), tungsten nitride (WN), ruthenium oxide (RuO$_2$), cobalt silicide (CoSi), nickel silicide (NiSi)), transition metal aluminides (e.g. Ti$_3$Al, ZrAl), TaC, TaMgC, carbon nanotube, conductive carbon, graphene, or any suitable combination of these materials. The conductive material may further comprise dopants that are incorporated during or after deposition. In some embodiments, the gate may further comprise a workfunction setting layer between the gate dielectric and gate conductor. The workfunction setting layer can be a workfunction metal (WFM). WFM can be any suitable material, including but not limited a nitride, including but not limited to titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a carbide, including but not limited to titanium carbide (TiC) titanium aluminum carbide (TiAlC), tantalum carbide (TaC), hafnium carbide (HfC), and combinations thereof. In some embodiments, a conductive material or a combination of multiple conductive materials can serve as both gate conductor and WFM. The gate conductor and WFM can be formed by any suitable process or any suitable combination of multiple processes, including but not limited to, atomic layer deposition (ALD), chemical vapor deposition (CVD), physical vapor deposition (PVD), sputtering, plating, evaporation, ion beam deposition, electron beam deposition, laser assisted deposition, chemical solution deposition, etc.

Contacts, such as TS contact, CA contacts, and CB contacts are metallic contact. A metal contact can be formed or filled using, but is not limited to, tungsten (W), aluminum (Al), or copper (Cu), cobalt (Co), nickel (Ni) which can further include a barrier layer. The barrier layer can be, but is not limited to, titanium nitride (TiN), tantalum nitride (TaN), hafnium nitride (HfN), niobium nitride (NbN), tungsten nitride (WN), or combinations thereof, where the barrier layer can prevent diffusion and/or alloying of the metal contact fill material with the top source drain material, and/or anode/cathode material. In various embodiments, the barrier layer can be conformally deposited in the trench(es) by ALD, CVD, MOCVD, PECVD, or combinations thereof. In various embodiments, the metal fill can be formed by ALD, CVD, and/or PVD to form the electrical contacts.

A mask can be used for patterning, etching, recessing, and many other purposes. A mask contemplated herein can be a photoresist mask or a sacrificial hard mask.

With reference to FIG. 1, this figure depicts an example fabrication operation for fabricating an example semiconductor device with an isolation structure for electrically isolating one contact from another contact in accordance with an illustrative embodiment. The fabrication system (system) uses a wafer of substrate 102 to fabricate an example finFET. Besides FinFET, this invention applies to other device architectures, including but not limited to, planar transistor, nanowire transistor, nanosheet transistor, vertical transistor, fully depleted SOI (FDSOI) transistor.

FIG. 1 depicts two views of the structures of the device being fabricated. The 'TOP' view is the view of the device structures along X and Z axes, which is assumed to be the plane of fabrication in these figures. View AA' is the view along X and Y axes at section line AA' depicted in the TOP view. All similarly labeled views are oriented in a similar manner in subsequent figures unless expressly distinguished where used.

The system forms gates 104 and 106 with gate dielectric 108. Gate dielectric 108 can be a film of a suitable high-k material deposited in a suitable manner and at a suitable step for gate formation. Spacers 110 and 112 electrically insulate gate 104 from other structures, such as the S/D structures corresponding to gate 104. Similarly, spacers 114 and 116 electrically insulate gate 106 from other structures, such as the S/D structures corresponding to gate 106. As a non-limiting example, spacers 110, 112, 114, and 116 can be formed using a suitable fabrication method and a suitable insulator, such as SiBCN or SiOCN. Epitaxy (epi) 118 is an example of an S/D structure. The system channels substrate 102 and grows epi 118 in the channel. The source/drain epi can be in-situ doped (meaning doped during epitaxy growth), or ex-situ doped (adding dopants to S/D after epitaxy), or a combination of both in-situ and ex-situ. Some example doping methods include ion implantation, gas phase doping, plasma doping, plasma immersion ion implantation, cluster doping, infusion doping, liquid phase doping, solid phase doping, etc.

The system recesses metal gates 104 and 106 to form recess 122 at each gate. A suitable inter-level dielectric (ILD) 120 protects epi 118 during the gate recessing.

In one example non-limiting fabrication process, the system may first fabricate dummy gates (not shown) on top and/or around a semiconductor channel, form spacers 110, 112, 114, and 116 on dummy gate sidewalls, forming source/drain 118 (e.g., by epitaxy), and form ILD 120. The system may then remove the dummy gates for depositing the gate dielectric 108, forming metal gates 104 and 106. The system may then recess metal gates 104 and 106 to depth 122. In some embodiments, the gate dielectric 108 is also recessed as shown in FIG. 1. In other embodiments, the gate dielectric 108 is not recessed.

Figure 2:
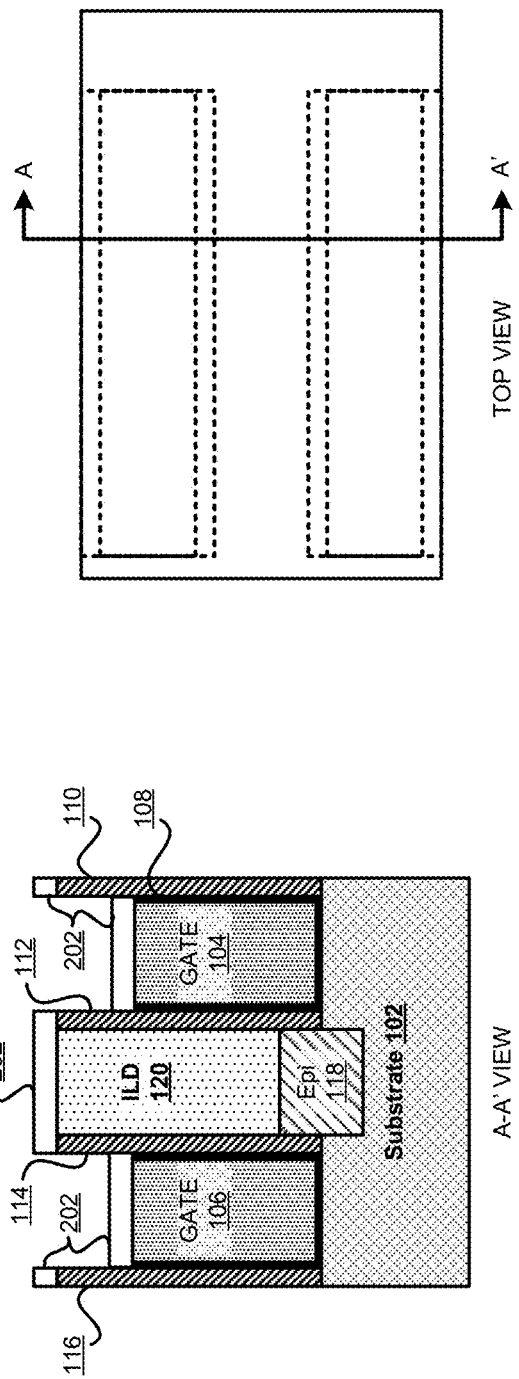
FIG. 2 depicts another example fabrication operation during the fabrication of the example device with electrically isolated contacts in accordance with an illustrative embodiment.

With reference to FIG. 2, this figure depicts another example fabrication operation during the fabrication of the example device with electrically Isolated contacts in accordance with an illustrative embodiment. The system performs a directional deposition of a suitable dielectric 202, e.g., SiCO. The system performs the directional deposition process such that dielectric 202 deposition is limited substantially only to the horizontal surfaces (relative to the plane of fabrication, which is also assumed to be horizontal in these examples).

In other words, the directional deposition causes dielectric 202 to deposit on the exposed horizontal surfaces of the device and not on any exposed vertical surfaces of the device. In the depicted example, dielectric 202 deposits over gates 104 and 106, spacers 110, 112, 114, and 116, and ILD 120. If some dielectric 202 should inadvertently also deposit on any portion of a vertical surface, such as a sidewall of spacer 112, the system can etch back the inadvertently deposited dielectric 202 from such a vertical surface. An alternative way to form the dielectric cap 202 is to deposit a dielectric material to fill the opening on top of gate, planarize the dielectric, and then recess the dielectric. A preferred but non-limiting thickness of dielectric cap 202 is between 5 nm and 15 nm.

Figure 3:
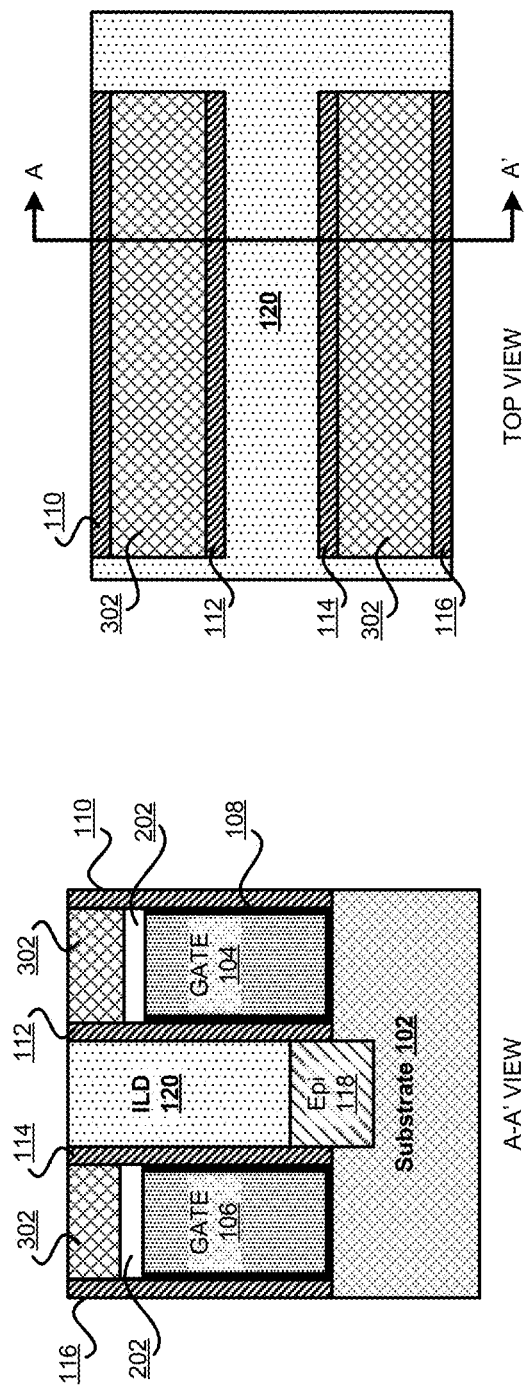
FIG. 3 depicts another example fabrication operation during the fabrication of the example device with electrically isolated contacts in accordance with an illustrative embodiment.

With reference to FIG. 3, this figure depicts another example fabrication operation during the fabrication of the example device with electrically isolated contacts in accordance with an illustrative embodiment. The system fills or deposits recess 122 over gates 104 and 106 with a dielectric 302. In one embodiment, dielectric 302 is different from dielectric 202. For example, dielectric 302 may be SiN.

The system planarizes dielectric 302 such that the planarization stops after removing dielectric 202 from ILD 120 and spacers 110-116 but before reaching dielectric 202 above gates 104 and 106. CMP is one example method of planarization that is usable by the system for planarizing dielectric 302.

Figure 4:
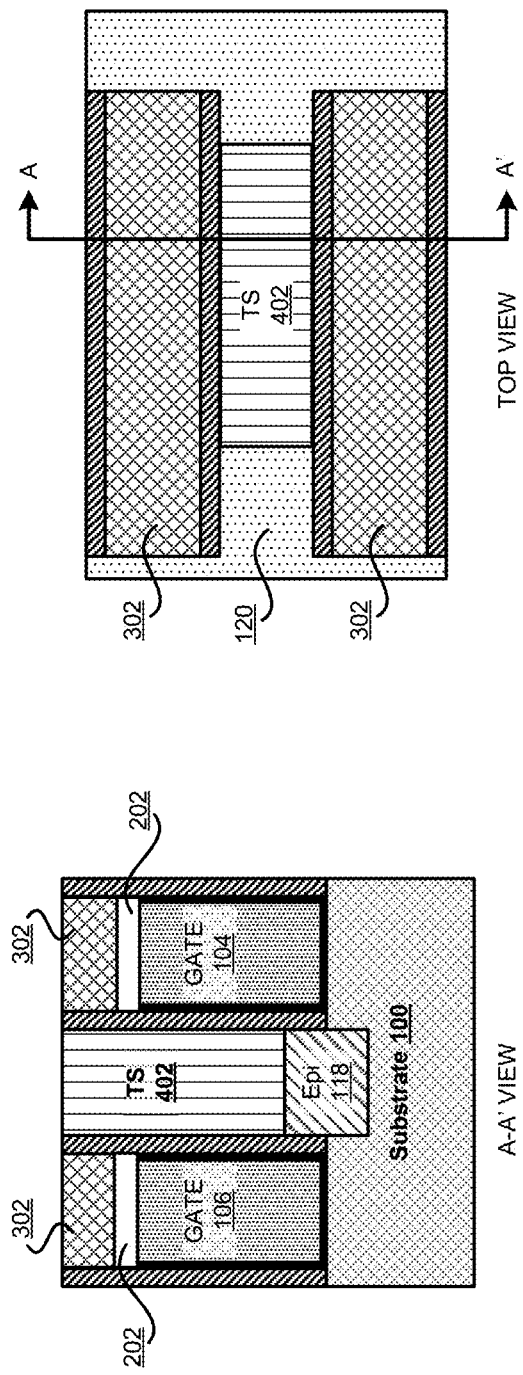
FIG. 4 depicts another example fabrication operation during the fabrication of the example device with electrically isolated contacts in accordance with an illustrative embodiment.

With reference to FIG. 4, this figure depicts another example fabrication operation during the fabrication of the example device with electrically Isolated contacts in accordance with an illustrative embodiment. The system patterns for forming TS contact 402. The TS contact physically and electrically contacts the source/drain 118. Specifically, the system uses a mask to pattern or etch ILD 120 from above epi 118. The system fills a suitable conductor, such as Tungsten (W) or cobalt (Co) in the patterned recess left behind by removed ILD 120. The system planarizes, e.g., using CMP, the filled conductor. The filled and planarized conductor forms TS 402, which is electrically coupled to epi 118. As described earlier, the contact may comprise a conductive liner on trench sidewalls before filling the rest of the trench with W or Co.

Figure 5:
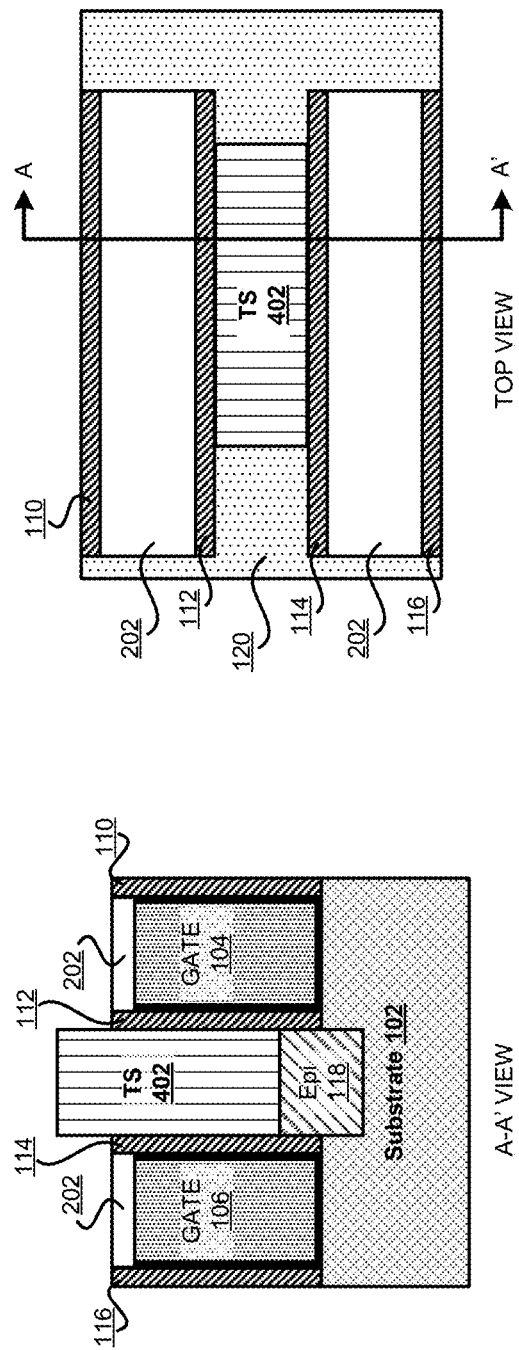
FIG. 5 depicts another example fabrication operation during the fabrication of the example device with electrically isolated contacts in accordance with an illustrative embodiment.

With reference to FIG. 5, this figure depicts another example fabrication operation during the fabrication of the example device with electrically Isolated contacts in accordance with an illustrative embodiment. The system etches dielectric 302 and spacers 110-116 up to and exposing dielectric 202 above gates 104 and 106. The etching method employed for this etching leaves TS 402 substantially intact. One example method of etching that can be used at this step of the fabrication process is isotropic etching. Other suitable etching methods include directional etching and other etching methods known to those skilled in the art.

Figure 6:
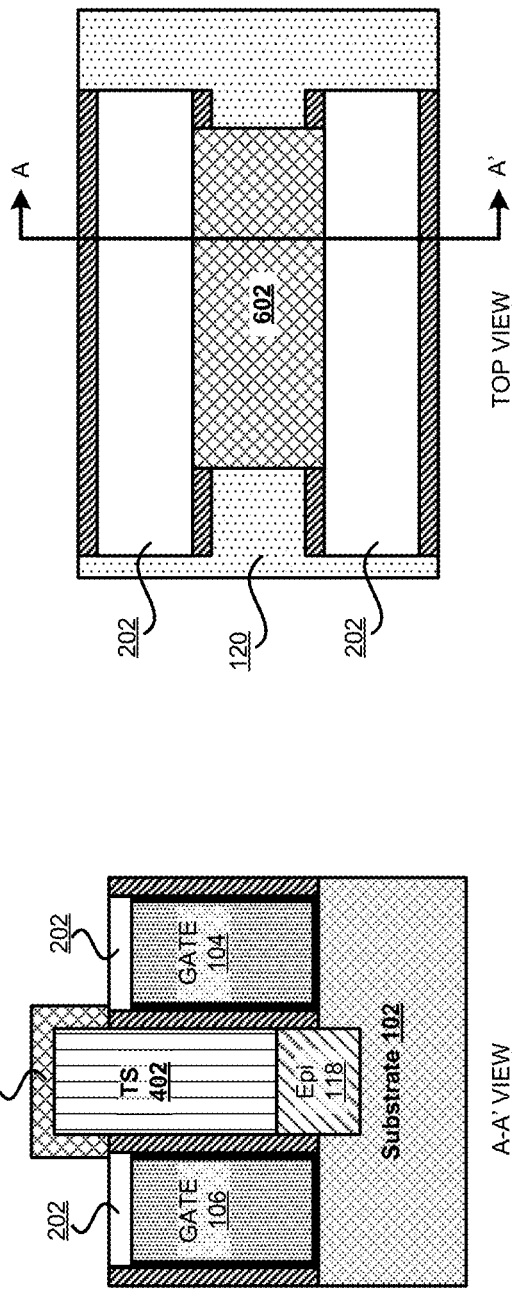
FIG. 6 depicts another example fabrication operation during the fabrication of the example device with electrically isolated contacts in accordance with an illustrative embodiment.

With reference to FIG. 6, this figure depicts another example fabrication operation during the fabrication of the example device with electrically isolated contacts in accordance with an illustrative embodiment. The system forms insulator cap 602 over exposed TS 402. Specifically, according to one embodiment, the system performs a selective growth operation in which a suitable insulator material, e.g., SiN, is selectively deposited over conductive metal surfaces. Since TS 402 is the only exposed metal surface of the device oriented towards the depositing apparatus, and other surface areas are covered with dielectric 202 as shown, the insulator material deposits on all exposed surfaces of TS 402 to form cap 602 around TS 402. Because gates 104 and 106 are also formed of conductive metal, dielectric 202 was deposited on gates 104 and 106 as described herein so that depositing insulator cap 602 over the gates can be avoided at this step.

Figure 7:
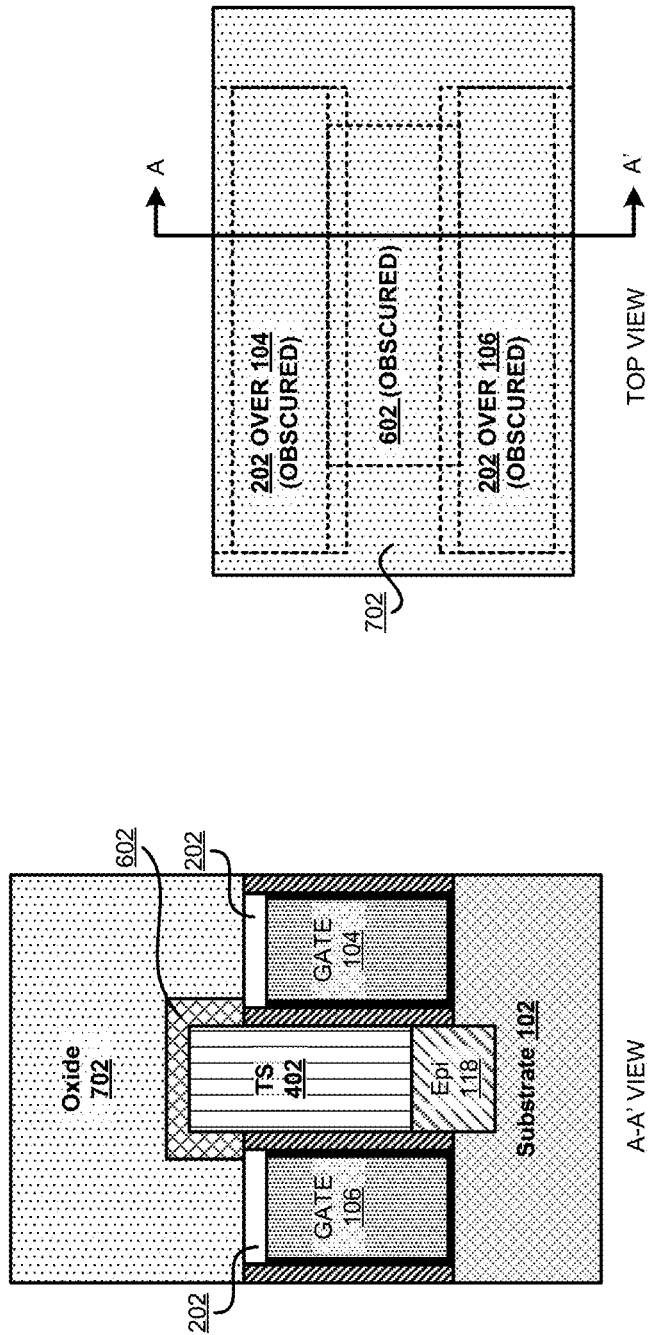
FIG. 7 depicts another example fabrication operation during the fabrication of the example device with electrically isolated contacts in accordance with an illustrative embodiment.

With reference to FIG. 7, this figure depicts another example fabrication operation during the fabrication of the example device with electrically isolated contacts in accordance with an illustrative embodiment. The system covers substantially the entire device area with a suitable insulator material 702, such as silicon oxide (oxide).

Figure 8:
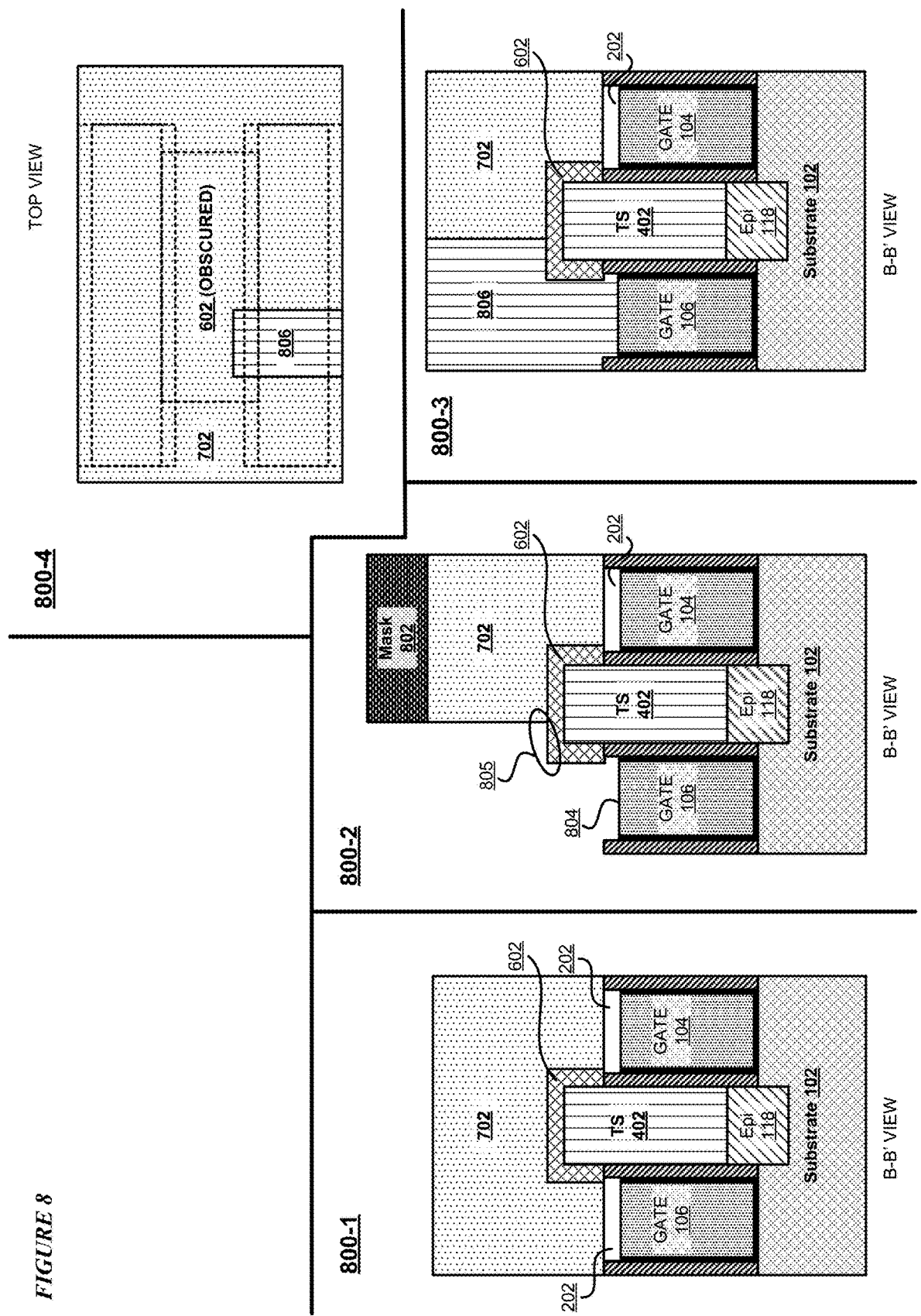
FIG. 8 depicts another example fabrication operation during the fabrication of the example device with electrically isolated contacts in accordance with an illustrative embodiment.

With reference to FIG. 8, this figure depicts another example fabrication operation during the fabrication of the example device with electrically isolated contacts in accordance with an illustrative embodiment. The system uses mask 802 to mask those portions of insulator 702 where a gate contact is not to be formed. In other words, mask 802 include an opening where a gate contact is to be formed, e.g., for gate 106, while protecting the remainder of the device. View 800-1 is the state of the device fabrication at section line B-B' at the end of the process described with respect to FIG. 7.

View 800-2 shows mask 802 positioned such that the opening for etching oxide 702 is positioned over gate 106. The system uses a suitable etching process to etch oxide 702 and dielectric 202 through the opening to remove oxide 702 and dielectric 202 from above gate 106, exposing the conductive metal of gate 106.

View 800-3 shows CB contact 806 formed in electrical coupling with gate 106. To form CB contact 806, the system fills the etched recess at gate metal 804 with a suitable contact metal, e.g., Tungsten, to form CB contact 806. Notice that the mask opening may be larger than the gate surface 804. As shown in view 800-2, the mask opening overlaps part of the S/D area over TS 402. However, the presence of cap 602 prevents the etching of TS 402, and cap 602 itself is resistant to the etching process used. As shown in view 800-3, filling CB contact metal 806 even with some overlap with other structures, still avoids short-circuit between CB contact 806 and TS contact 402 due to the presence of contact isolation structure—insulator cap 602. Top view 800-4 shows the relative positioning of CB contact 806 and cap 602.

Figure 9:
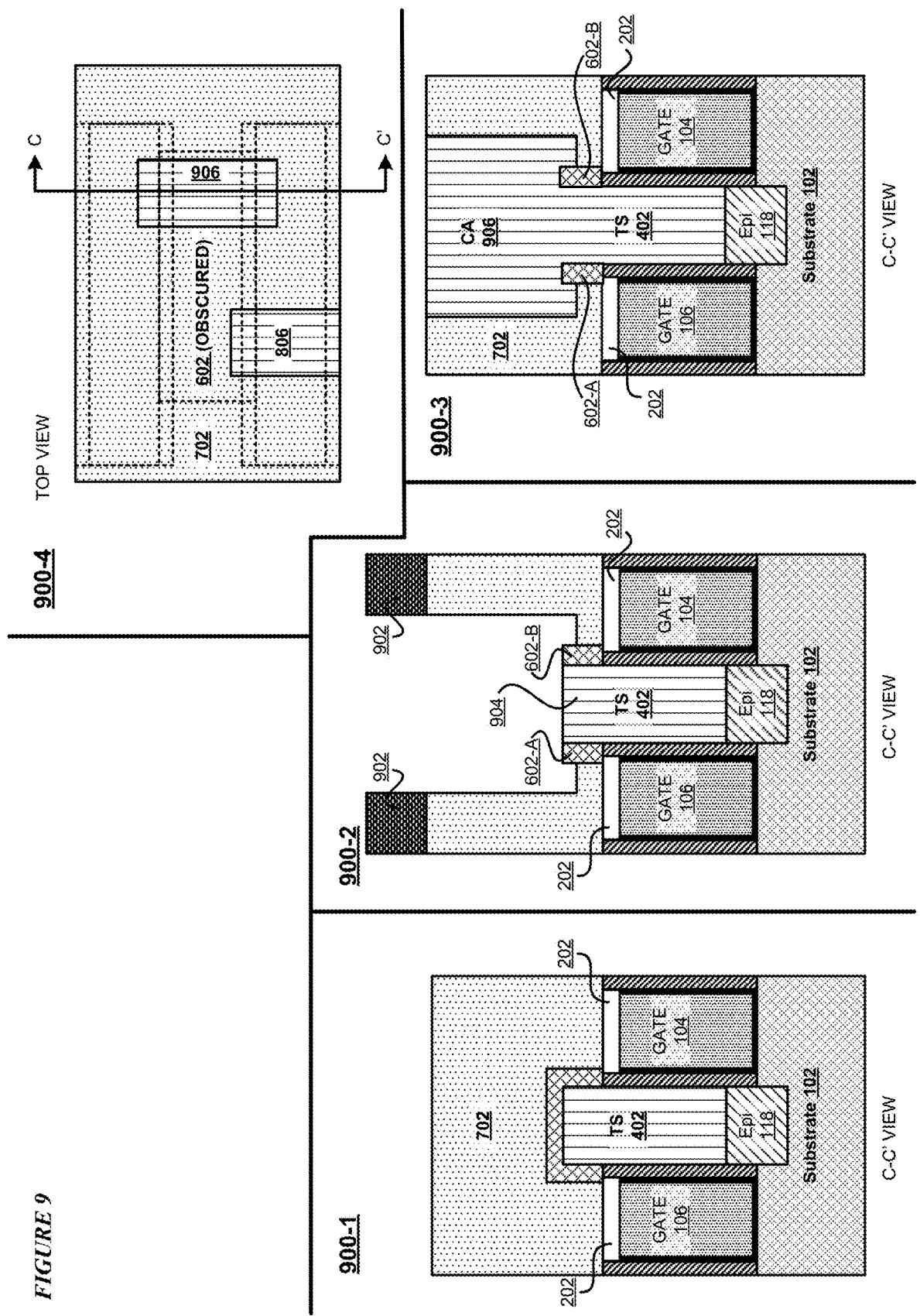
FIG. 9 depicts another example fabrication operation during the fabrication of the example device with electrically isolated contacts in accordance with an illustrative embodiment.

With reference to FIG. 9, this figure depicts another example fabrication operation during the fabrication of the example device with electrically Isolated contacts in accordance with an illustrative embodiment. View 900-1 is the state of the device at section line C-C' after CB contact 806 is formed according to FIG. 8. The system positions mask 902, which has an opening to protect the rest of the device and expose only a region above TS 402 for etching. The system first etches oxide 702 from above TS 402, and perhaps even from over the gates regions if the size of the opening is larger than the size of surface 904 of TS 402 to be exposed. The system then etches the top portion of cap 602 (e.g., by directional etch such as reactive ion etch (RIE))

to expose surface 904 of TS 402. The side portions of cap 602, namely 602-A and 602-B, remain in place when the system stops the etching before the entire depth of oxide 702 is etched from above gates 104 and/or 106. In the case that the entire oxide above the gate is etched, the dielectric cap 202 serves as an etch stop layer and provides electrical isolation between later formed CA contact 906 to gate 104 and 106.

As shown in view 900-3, the system fills the recess formed above surface 904 of TS 402 with a suitable contact metal to form CA contact 906. Tungsten is one example contact metal usable to form CA contact 906. Alternatively, cobalt can be used to form contacts. Top view 900-4 shows the relative positioning of CB contact 806 and CA contact 906.

Figure 10:
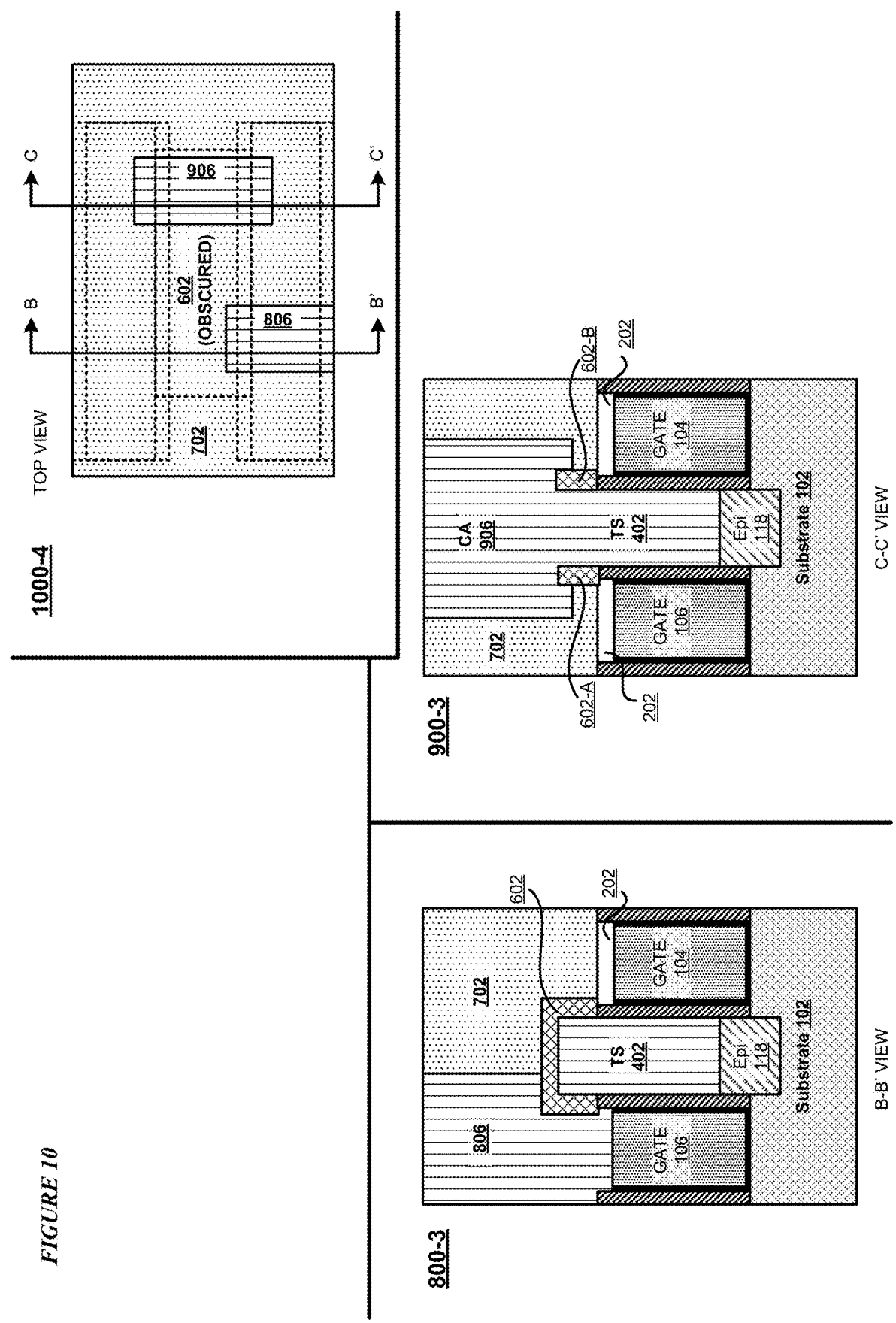
FIG. 10 depicts certain illustrative views of the example device with electrically isolated contacts in accordance with an illustrative embodiment.

With reference to FIG. 10, this figure depicts certain illustrative views of the example device with electrically isolated contacts in accordance with an illustrative embodiment. View 800-3 is along B-B' section line, as also shown in FIG. 8, shows CB contact 806 formed for gate 106. A second CB gate contact (not shown) can be similarly formed for gate 104.

View 900-3 is along C-C' section line, which is also shown in FIG. 9, shows CA contact 906 formed for TS 402, which connects to S/D structure epi 118. View 1000-4 shows section lines B-B' and C-C' used in views 800-3 and 900-3. View 1000-4 shows the relative positioning of CB contact 806 and CA contact 906.

While certain steps and processes are described with certain structures, it is to be understood that the steps and/or processes can be adapted to fabricate any of the structure variations described herein within the scope of the illustrative embodiments. While certain materials are used in multiple layers or structures, it is to be understood that substitute materials or different but functionally equivalent materials can be used in place of the described materials at any layers described herein within the scope of the illustrative embodiments. While certain fabrication methods have been used at certain steps, it is to be understood that a fabrication method may be omitted, added, or modified at a described step to achieve functionally similar result from the semiconductor structure within the scope of the illustrative embodiments. While certain operations are described as a "step", several operations can be combined together to form a single fabrication step in a process described herein. While certain orientations have been referred to as "top" and "bottom" with reference to an example vertical orientation of the proposed device, it is to be understood that the device can be reoriented laterally such that the top and bottom become left/right or right/left, or bottom and top, or front/back or back/front, as the reorientation case may be.

Thus, a semiconductor device, fabrication method therefor, and a fabrication system or apparatus therefor using a software implementation of the method, are provided in the illustrative embodiments for electrically isolated contacts in an active region of a semiconductor device and other related features, functions, or operations. Where an embodiment or a portion thereof is described with respect to a type of semiconductor device, the fabrication method, system or apparatus, the software implementation, or a portion thereof, are adaptable or configurable for use with a different manifestation of that type of device.

The present invention may be a semiconductor device, system, a method, and/or a computer program product at any possible technical detail level of integration. The computer program product may include a computer readable storage medium (or media) having computer readable program instructions thereon for causing a processor to carry out aspects of the present invention. A computer readable storage medium, including but not limited to computer-readable storage devices as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network.

What is claimed is:

1. A semiconductor device comprising:
a TS contact electrically coupling with a first structure of the semiconductor device;
a dielectric deposited at least on a surface of a gate, wherein the surface is substantially parallel to a plane of fabrication of the semiconductor device;
an insulator cap surrounding an exposed portion of the TS contact;
an opening in the insulator cap, wherein a CA contact is formed through the opening to electrically couple with the first structure of the semiconductor device; and
a CB contact electrically coupling with the gate of the semiconductor device, wherein the CB contact is formed through an opening in the dielectric at a first portion of the surface, the dielectric continuing to cover a second portion of the surface, and wherein a portion of the insulator cap is interposed between the CA contact and the CB contact.

2. The semiconductor device of claim 1, wherein the TS contact allows electrical connectivity to the first structure.

3. The semiconductor device of claim 1, wherein the semiconductor device comprises a transistor, and wherein the first structure comprises a source/drain (S/D) structure of the transistor.

4. The semiconductor device of claim 1, wherein the insulator cap surrounds the exposed portion of the TS contact by covering all exposed surfaces of the exposed portion of the TS contact with an insulator material.

5. The semiconductor device of claim 1, wherein the insulator cap is fabricated using silicon nitride (SiN).

6. The semiconductor device of claim 1, wherein the CB contact overlaps a region of the first structure, wherein the portion of the insulator cap maintains electrical isolation between the CA contact and the CB contact regardless of the overlap.

7. The semiconductor device of claim 1, wherein the exposed portion is formed by etching a surrounding dielectric material down to a level below a height of the TS contact.

8. The semiconductor device of claim 1, wherein the dielectric is directionally deposited on a set of surfaces, wherein each surface in the set of surfaces is substantially parallel to the plane of fabrication, the set of surfaces including the surface of the gate.

\* \* \* \* \*